United States Patent [19]

Roelofs

[11] Patent Number: 5,001,385
[45] Date of Patent: Mar. 19, 1991

[54] ELECTRON BEAM APPARATUS WITH ADJUSTING MECHANISM FOR A THERMALLY EMITTING CATHOD TIP

[75] Inventor: Bernardus J. G. M. Roelofs, Eindhoven, Netherlands

[73] Assignee: U.S. Philips Corp., New York, N.Y.

[21] Appl. No.: 316,393

[22] Filed: Feb. 27, 1989

[30] Foreign Application Priority Data

Mar. 3, 1988 [NL] Netherlands ............. 8800539

[51] Int. Cl.$^5$ ............................. H01J 1/16; H01J 19/10
[52] U.S. Cl. .......................................... 313/37; 313/336
[58] Field of Search ................................. 313/336, 37

[56] References Cited

U.S. PATENT DOCUMENTS

| | | | |
|---|---|---|---|
| 3,532,923 | 10/1976 | Vogel | 313/341 |
| 4,068,145 | 1/1978 | Nakagawa et al. | 313/336 X |
| 4,311,941 | 1/1982 | Hiraoka et al. | 313/336 |

Primary Examiner—Donald J. Yusko
Assistant Examiner—Michael Horabik

[57] ABSTRACT

In order to avoid undesired variations in the emission current intensity of a clamping device for a thermally emitting cathode tip constructed from pyrolytice graphite, a resilient coupling compensating the thermal stresses n the graphite is provided in an electron beam apparatus.

6 Claims, 1 Drawing Sheet

ELECTRON BEAM APPARATUS WITH ADJUSTING MECHANISM FOR A THERMALLY EMITTING CATHOD TIP

The invention relates to an electron beam apparatus comprising a thermally emitting cathode tip clamped between blocks of pyrolytic graphite.

A cathode construction for such an apparatus is disclosed in U.S. Pat. No. 3,532,923.

An electron emitter described in the said Patent Specification comprises a cathode tip which is clamped between two blocks of pyrolytic graphite serving as heating elements. The blocks of graphite are mounted on carriers which at one end are connected in a block of insulating material and at the opposite ends supporting the graphite blocks clamp the cathode tip by means of a screw connection. The supports also serve as current supply conductors.

When such a cathode construction is used, for example, in an electron beam writer, it is experienced as a drawback that current intensity variations occur in the electron beam emitted by the cathode which are extremely unfavourable for a good operation of the apparatus.

It is the object of the invention to avoid the said drawbacks starting from the assumption that the current intensity variations are caused by variations in the thermal conductivity and/or the electric conductivity in the graphite blocks during operation. For that purpose an electron beam apparatus of the type mentioned in the opening paragraph is characterized according to the invention in that one of the blocks of pyrolytic graphite comprises an adjusting mechanism for compensating for thermal variations in shape in the graphite.

Since the movement mechanism can compensate for stresses occurring in the graphite blocks, for example, by thermal expansion etc., the occurrence of variation in the thermal conductivity and/or the electric conductivity in the graphite blocks is avoided and hence temperature variations in the cathode tip, and hence also unwanted variations in the current intensity of an electron beam to be emitted are removed.

In a preferred embodiment an end face of a graphite block facing a support comprises a metal layer which is ductile at the operating temperature. Such a metal layer can sufficiently compensate for variations in shape which are detrimental for many applications.

In a further preferred embodiment a graphite block is connected to a support via an orthogonal V-groove construction coupled by means of a ball. This construction can compensate for dertrimental variations in shape by a wobbling movement about the ball.

In a further preferred embodiment a metal intermediate block for one of the graphite blocks is mounted on a diaphragm which is connected at the other end to a support with which the graphite block is clamped resiliently by bending via the intermediate block. In this case also, the resilient clamping also permits variations in shape in the graphite block, while the mounting of the diaphragm ensures a good positioning of the block.

A few preferred embodiments according to the invention will be described in greater detail with reference to the drawing, in which.

Figure 1:
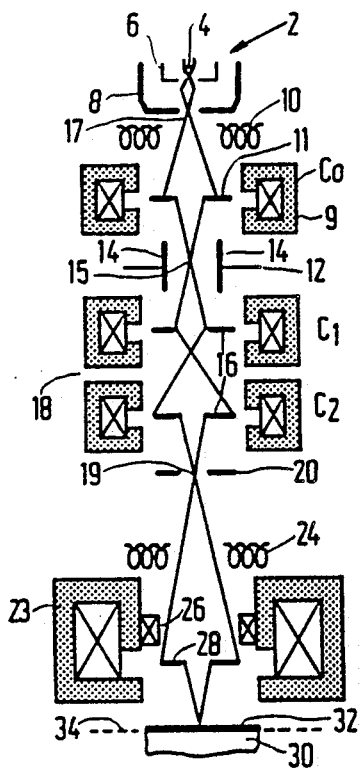
FIG. 1 shows diagrammatically an electron beam apparatus.

An electron beam apparatus as shown in FIG. 1 comprises an electron source 2 having a cathode 4, a Wehnelt electrode 6 and an anode 8, beam alignment coils 10, a Co-lens 9 having a diaphragm 11, a beam interrupting device 12, a condensor lens system 18 with condensor diaphragms 16, a diaphragm 20, a deflection device 24, an exit lens 23 with a post-focusing lens 26, an exit diaphragm 28 and a specimen table 30 with specimen 32 situated in a specimen plane 34.

Figure 2A:
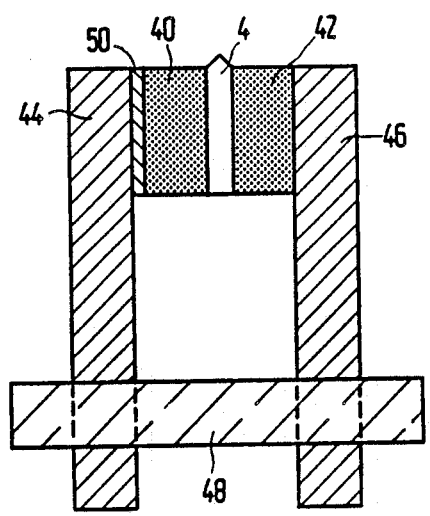
FIGS. 2a, 2b and 2c show various clamping devices of a cathode tip therefor.

FIG. 2a shows a cathode tip 4, for example, of $LaB_6$, a graphite block 40, a second graphite block 42 and supports 44 and 46 which are clamped in an assembling block 48 of electrically insulating material and which may serve as current supply conductors. The graphite block 40, optionally also the graphite block 42, comprises, on its side facing the support, a metal layer 50 which is provided on the graphite, for example, by sputtering or by any other readily bonding method and at the usual operating temperatures is sufficiently ductile to compensate for variations in shape of the graphite. The layer is, for example, of platinum or tungsten and has a thickness, for example of approximately 0.5 mm.

Figure 2B:
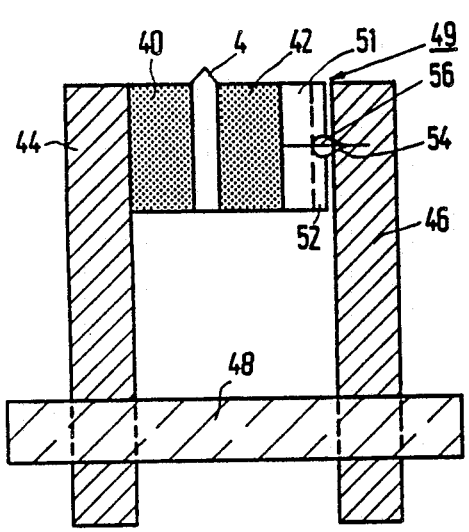

FIG. 2b corresponding elements are referred to by the same reference numerals and the Figure shows a gaphite block 42, and adjusting mechanism 49 with a metal intermediate member 51 which has a V-groove and is connected to the block 42, and a support 46 with a V-groove 54 extending at right angles to the V-groove 52. Both V-grooves are coupled to a ball 56 around which the graphite blocks with the cathode tip perform a wobbling movement compensatimg for stresses, the positioning of the cathode tip remaining ensured.

Figure 2C:
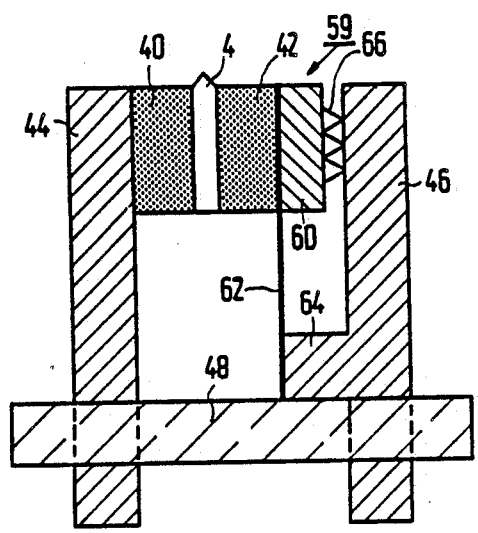

In FIG. 2c corresponding elements are also referred to be the same reference numerals; in this Figure an adjusting mechanism 59 which in this case is formed by metal intermediate block 60 mounted on a diaphragm 62, is added to a graphite block 42. One end of the diaphragm remote from the intermediate block 60 is connected to an assembly block 64 on which moreover a support 46 is mounted. By means of a pressure spring mechanism 66 the graphite block 42 and hence the cathode tip 4 is clamped resiliently in such a manner that thermal variations in shape can be compensated for. The diaphragm ensures a permanently exact positioning of the cathode tip.

I claim:

1. An electron beam apparatus having a thermally emitting cathode tip (4) clamped between blocks of pyrolytic graphite (40, 42). one of the blocks of pyrolytic graphite (40, 42) comprising an adjusting mechanism (50) for compensating for thermal variations in shape in the pyrolytic graphite, characterized in that the adjusting mechanism is formed by a metal layer (50) which is bonded to a side of a graphite block (40) adjoining a support and which is ductile at operating tempertures.

2. An electron beam apparatus having a thermally emitting cathode tip (4) clamped between blocks of pyrolytic graphite (40, 42), one of the blocks of pyrolytic graphite (40, 42) comprising an adjusting mechanism (49) for compensating for thermal variations in shape in the pyrolytic graphite, characterized in that the adjusting mechanism comprises a metal intermediate member (51) having a V-groove (52) which is coupled, via ball (56), to a V-groove (54) which extends at right angles thereto and which is provided in a supporting arm (46).

3. An electron beam apparatus having a thermally emitting cathode tip (4) clamped between blocks of pyrolytic graphite (40, 42), one of the blocks of pyrolytic graphite (40, 42) comprising an adjusting mechanism (59) for compensating for thermal variations in shape in the pyrolytic graphite, characterized in that the adjusting mechanism comprises a metal intermediate block (60) which is mounted on one end of a diaphragm (62) and which is coupled, via a pressure spring connection (66), to a supporting arm (46) which is coupled to the other end of the diaphragm via an assembling block (64).

4. A thermally emitting cathode for an electron beam apparatus, comprising a cathode tip (4) clamped between blocks of pyrolytic graphite (40, 42), one of the blocks of pyrolytic graphite (40, 42) comprising an adjusting mechanism (50) for compensating for thermal variations in shape in the pyrolytic graphite, characterized in that the adjusting mechanism is formed by a metal layer (50) which is bonded to a side of a graphite block (40) adjoining a support and which is ductile at operating temperatures.

5. A thermally emitting cathode for an electron beam apparatus, comprising a cathode tip (4) clamped between blocks of pyrolytic graphite (40, 42), one of the blocks of pyrolytic graphite (40, 42) comprising an adjusting mechanism (49) for compensating for thermal variations in shape in the pyrolytic graphite, characterized in that the adjusting mechanism is a metal intermediate member (51) having a V-groove (52) which is coupled, via a ball (56), to a V-groove (54) which extends at right angles thereto and which is provided in a supporting arm (46).

6. A thermally emitting cathode for an electron beam apparatus, comprising a cathode tip (4) clamped between blocks of pyrolytic graphite (40, 42), one of the blocks of pyrolytic graphite (40, 42) comprising an adjusting mechanism (59) for compensating for thermal variations in shape in the pyrolytic graphite, characterized in that the adjusting mechanism is a metal intermediate block (60) which is mounted on one end of a diaphragm (62) and which is coupled, via a pressure spring connection (66), to a supporting arm (46) which is coupled to the other end of the diaphragm via an assembling block (64).

* * * * *